United States Patent [19]

Sellers et al.

[11] Patent Number: 6,075,363

[45] Date of Patent: Jun. 13, 2000

[54] METHOD FOR NOISE REDUCTION IN THE OPERATION OF A GRADIENT COIL

[75] Inventors: Michael Sellers, Thakeham, United Kingdom; Franz Boemmel; Arthur Kaindl, both of Erlangen, Germany

[73] Assignee: Siemens Aktiengesellschaft, Munich, Germany

[21] Appl. No.: 09/129,489

[22] Filed: Aug. 4, 1998

[30] Foreign Application Priority Data

Aug. 4, 1997 [DE] Germany ............................ 197 33 742

[51] Int. Cl.⁷ ....................................................... G01V 3/00
[52] U.S. Cl. ............................................ 324/318; 324/322
[58] Field of Search ..................................... 324/318, 319, 324/320, 321, 322, 300, 306, 307, 309

[56] References Cited

U.S. PATENT DOCUMENTS

| | | | |
|---|---|---|---|
| 4,954,781 | 9/1990 | Hirata ........................................ | 324/318 |
| 5,084,676 | 1/1992 | Saho et al. ................................. | 324/318 |
| 5,235,283 | 8/1993 | Lehne et al. ............................... | 324/318 |
| 5,256,969 | 10/1993 | Miyajima et al. ......................... | 324/318 |
| 5,617,026 | 4/1997 | Yoshino et al. ........................... | 324/318 |
| 5,990,680 | 11/1999 | Mansfield .................................. | 324/318 |

FOREIGN PATENT DOCUMENTS 0 597 528   5/1994   European Pat. Off. .

OTHER PUBLICATIONS

Derwent Abstract for Japanese Application 08–231731.
Derwent Abstract for Japanese Application 02–169637.

*Primary Examiner*—Louis Arana
*Attorney, Agent, or Firm*—Hill & Simpson

[57] ABSTRACT

In a method for noise reduction in the operation of a gradient coil of a magnetic resonance apparatus, at least a portion of the gradient coil is in contact with a reaction resin molding material. During operation of the gradient coil the reaction resin molding material is maintained at a temperature that is in the region of the glass transition temperature of the reaction resin molding material.

5 Claims, 4 Drawing Sheets

METHOD FOR NOISE REDUCTION IN THE OPERATION OF A GRADIENT COIL

BACKGROUND OF THE INVENTION

1. Field of the Invention

The present invention relates to a method for noise reduction in the operation of a gradient coil of a magnetic resonance apparatus, wherein at least a portion of the gradient coil is in contact with a reaction resin molding material.

2. Description of the Prior Art

In diagnostic magnetic resonance tomography apparatuses, considerable disturbing noise arises due to structural oscillations which occur due to the operation of the apparatus with controlled gradient coils. The noise level can exceed 120 dB.

For noise reduction, both passive and active measures are used. One passive noise reduction technique is to increase the rigidity of the gradient coil, as is known from German OS 41 41 514. The intrinsic oscillation behavior of the gradient coil system is thereby matched to smaller oscillation amplitudes and to higher frequencies, so that an effective damping can then be achieved using sound insulation measures.

German OS 41 41 514, as a further passive measure for reduction of disturbing noise, discloses connecting a casting resin molding compound with the gradient coils, which compound also achieves a good sound damping at the operating temperature of the gradient coil system, in addition to having a high modulus of elasticity. Due to the intensive cross-linking among one another of the macromolecules of the resin, a duroplast molding material can never simultaneously exhibit a high modulus of elasticity and a good inner mechanical damping.

As a further passive measure for noise reduction, it is known to build a hole structure into the gradient coil.

In European Application 0 507 528, an active measure for noise reduction is described employing the production of counter-sound via loudspeakers. In this way, noise at the ear of the patient is reduced.

A further measure for noise reduction in gradient coils is disclosed in U.S. Pat. No 4,954,781, which teaches arranging a sandwich structure between the patient to be examined and the main magnet. The sandwich structure includes a visco-elastic layer pressed by two parts.

The Derwent abstract for Japanese Application 08-231731 discloses polymer parts as an additive for resin compositions that include of a polymer core element and a polymer shell element, which respectively have specific glass transition temperatures. As an additive to resin compositions, an improved and effective suppression of oscillations is achieved over a broad temperature range.

The Derwent abstract for Japanese Application discloses 02-169637 a damping material for cars, machines, etc., employing a resin with a specific glass transition temperature. The glass transition temperature is in the range from 0° C. to 60° C.

SUMMARY OF THE INVENTION

An object of the present invention is to provide a method for noise reduction in the operation of a gradient coil of a magnetic resonance apparatus with which a further mechanical damping of the disturbing sound is possible.

The object is achieved in a method wherein during the operation of the gradient coil, the reaction resin molding material is held at a temperature that is in the region of the glass transition temperature of the reaction resin molding material. With this method, it is possible to increase the damping of the gradient coil, without having to use additional materials and/or expenses. The method exploits the fact that the loss factor that determines the mechanical damping increases by an order of magnitude in the region of the glass transition temperature. The inner damping curve of the reaction resin molding material passes through a maximum at the glass transition temperature.

In an embodiment of the method for noise reduction, during the operation of the gradient coil cooling takes place in such a way that the temperature of the reaction resin molding material is in the region of the glass transition temperature. Noise reduction can thereby be achieved only by means of a modification of the cooling system connected with the gradient coil.

In order to achieve a noise reduction already at the beginning of operation, in a further embodiment the reaction resin molding material is heated, before operation, to the temperature in the region of the glass transition temperature. For the heating, the gradient current supply, which is present anyway, can advantageously be used.

DESCRIPTION OF THE PREFERRED EMBODIMENTS

In general, the glass transition temperature of a plastic characterizes a transition between a glass-like or vitreous state and a rubber-elastic or gum-elastic state. Plastics include reaction resin molding materials, in particular epoxy resin molding materials. In the glass-like state, epoxy resins are formed by chain molecules that are branched and interlinked with one another. In the glass-like state, all the movements of the chain, and also the chain branchings, are frozen. Under the influence of external forces, the chains are distorted only elastically. Because of this, in the glass-like state a high shear modulus G' results as well as, a low mechanical damping tan δ, a low elongation at breakage $\epsilon_b$, and a high breakage stress $\sigma_b$. In this state, the material is hard and brittle.

At higher temperatures, secondary dispersion areas occur in the glass state, allowing lateral groups or short parts of the main chains to become movable. The contribution of these movements to the rigidity is expressed in the decrease of the shear modulus to about $2/3$ of the original value. The mechanical damping thereby passes through a first maximum.

In the softening region, i.e., in the temperature region around the glass transition temperature $T_g$, micro-Brownian motions are "freed". This means that in this temperature region not only lateral chains of molecules, but rather entire conglomerated molecules can move. In the rubber-elastic state, the micro-Brownian motions are then fully developed. In the passage through the softening phase, for duroplasts, for example, the shear modulus G' decreases by about two powers of ten; the damping is maximum.

The glass transition temperature also is characterized by modifications of mechanical and electrical characteristics that are due to the molecular modifications in the plastic. These modifications are revealed in the structure of the forming material. Thus, given temperature increases above the glass transition temperature $T_g$, the thermal coefficient of expansion α increases discontinuously at the glass transition temperature $T_g$. In addition, the dielectric constant $\epsilon_r$ and the dielectric loss factor tanδ also increase sharply at temperatures above the glass transition temperature $T_g$. The sharp increase of the dielectric constant has direct consequences on the partial discharge behavior of epoxy-resin-impregnated coils. In temperature regions above the glass transition temperature $T_g$, the partial discharge voltage decreases rapidly, and can be in the vicinity of the operating voltage. This is to be taken into account during operation.

Figure 1:
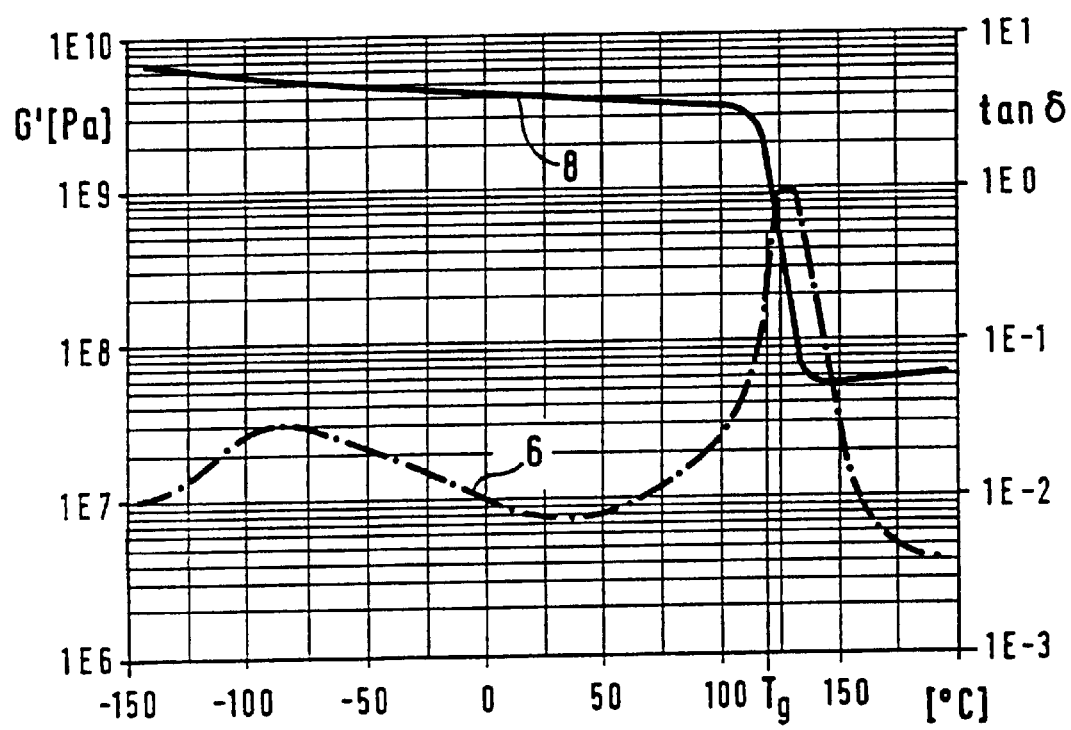
FIG. 1 shows, for a reaction resin molding material, the dependence of the shear modulus G', and the mechanical loss factor tan δ, as a function of temperature.

The diagram shown in FIG. 1 shows, for the example of an araldite casting resin system with a glass transition temperature of $T_g$=120° C., the curve 6 of the mechanical loss factor tan δ, and the curve 8 of the shear modulus G', dependent on the temperature, the measurement being made at a frequency of 1 Hz. The sharp increase of the mechanical loss factor tan δ in the region of the glass transition temperature $T_g$ is characteristic. If the temperature is increased above the glass transition temperature $T_g$, the shear modulus G' simultaneously decreases by two powers of ten.

Figure 2:
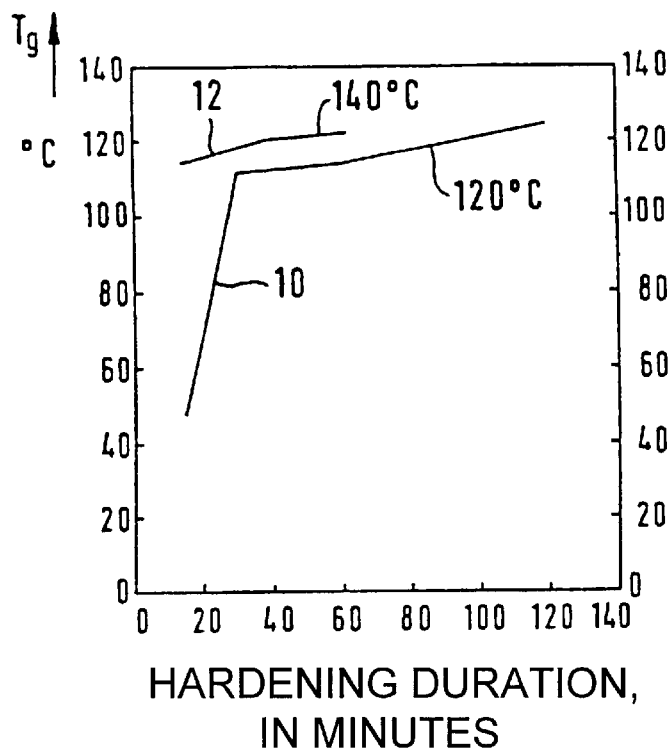
FIG. 2 shows, for a reaction resin molding material, the dependence of the glass transition temperature $T_g$ as a function of the hardening duration and hardening temperature.

The glass transition temperature $T_g$ can be set by means of various parameters in reaction resin molding materials. Thus, a higher flexibility imparting content in the reaction resin molding material lowers the glass transition temperature $T_g$. As further influencing quantities, the glass transition temperature can be set via the hardening duration and the hardening temperature. FIG. 2 shows as an example, in a diagram, of the dependency of the glass transition temperature $T_g$ on the hardening time, whereby the hardening time is indicated in minutes. The curve 10 shown in the diagram shows the glass transition temperature $T_g$ that results at a hardening temperature of 120° C. A steep increase of up to about 30 minutes hardening time is characteristic; after this, the glass transition temperature changes only in a small region, dependent on the hardening time. Reference numeral 12 indicates the glass transition temperature $T_g$ as a function of the hardening time at a hardening temperature of 140° C. In comparison to the curve 10, the steep increase in the curve 12 is not as pronounced.

Figure 3:
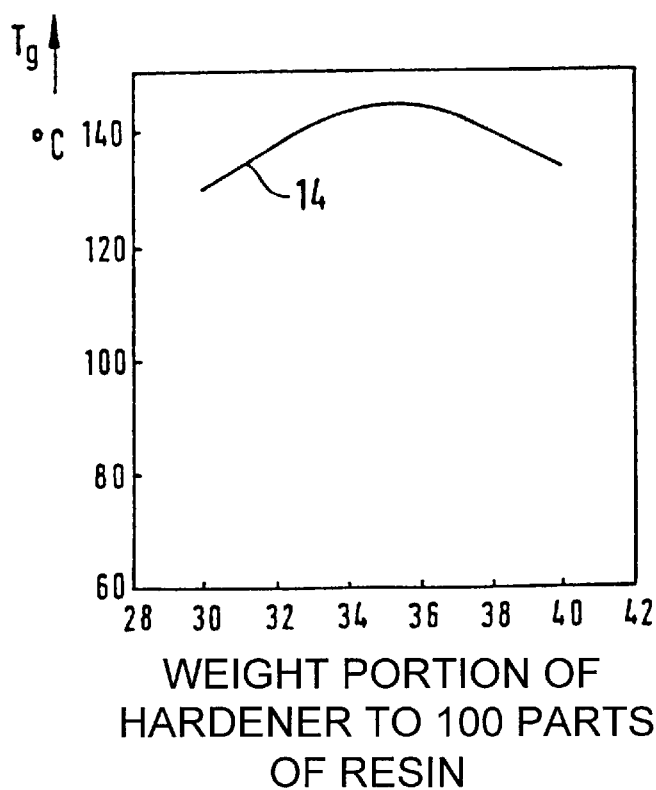
FIG. 3 shows, for a reaction resin molding material, the glass transition temperature $T_g$, as a function of the mixture ratio resin:hardener.

Finally, the glass transition temperature $T_g$ can also be set by adjusting the ratio of hardener/resin, as shown in FIG. 3. As a unit, on the abscissa the weight portion (GT) of hardener to 100 weight parts (GT) of resin is respectively indicated. The curve 14 shows a maximum of the glass transition temperature at approximately 35 weight parts hardener to 100 weight parts of resin.

Figure 4:
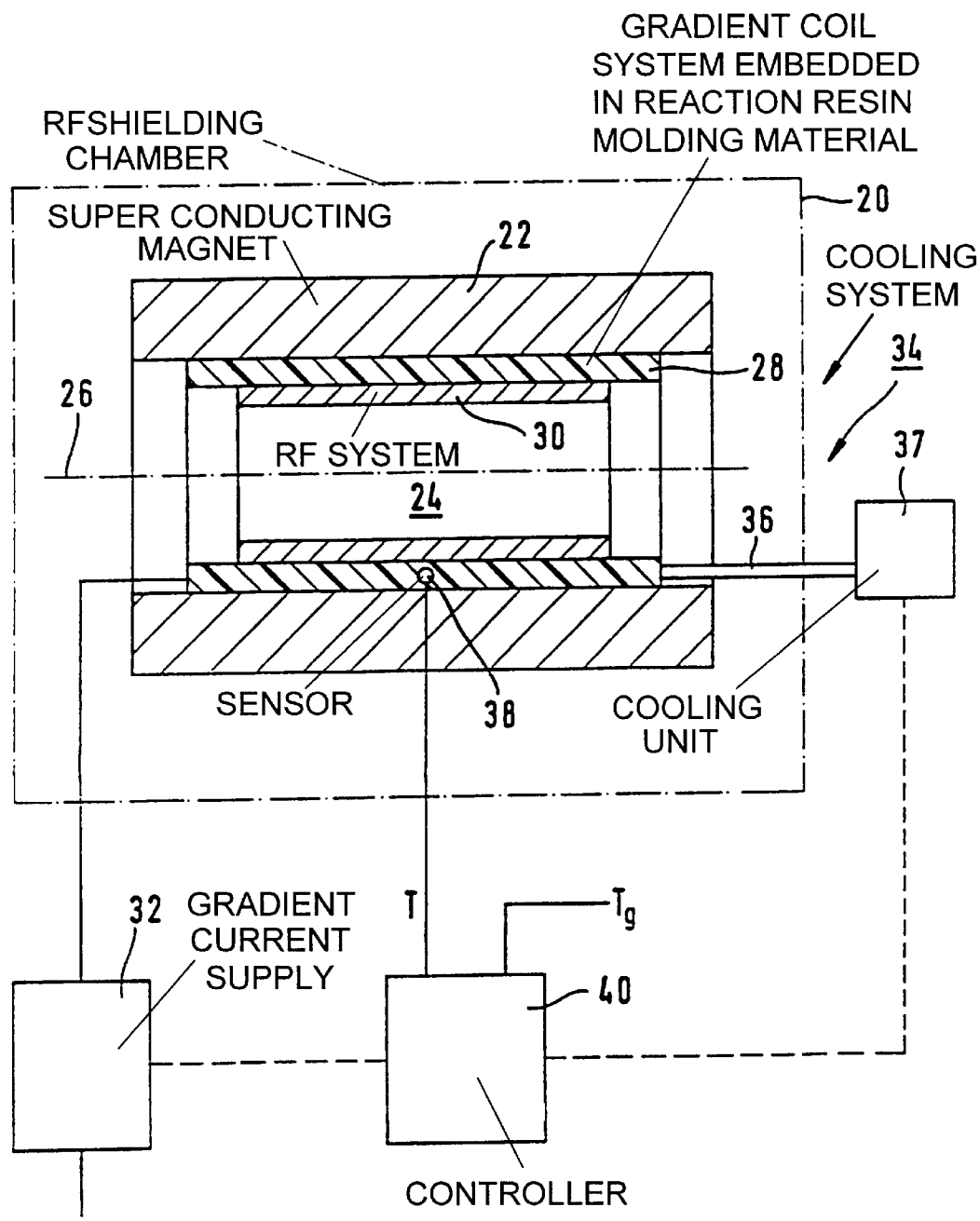
FIG. 4 shows a schematic diagram of a gradient system of a diagnostic magnetic resonance apparatus, whose operating temperature is maintained in the region of the glass transition temperature.

FIG. 4 shows a schematic representation of a sectional view of a diagnostic magnetic resonance apparatus, with the components that are relevant for noise production and noise reduction. Inside a radio-frequency shielding chamber 20 are arranged the components of the diagnostic magnetic resonance apparatus constructed for the reception of a patient. These components include a superconducting magnet 22, for the production of a static and homogenous magnetic field inside a cylindrical examination chamber 24. The direction of the magnetic field in the examination chamber proceeds parallel to the axis of symmetry 26. For the local resolution of the magnetic resonance signals, a gradient coil system 28 is required, which produces gradient magnetic fields that can vary chronologically and which are superposed on the main magnetic field in three spatial directions perpendicular to one another. The gradient system 28 is of conventional tube-shaped construction, as described for example in German OS 41 41 514, described above, and is immediately adjacent, in the inner chamber 24, to the basic field magnet 22. The coils belonging to the gradient system 28 are at least partially embedded in a reaction resin molding material, in particular an epoxy resin molding material. In addition, at the examination chamber 24 a radio-frequency system 30 is connected to the gradient system 28, for the excitation and reception of magnetic resonance signals. The chronologically variable gradient streams, which are in the kHz region, are produced by a gradient current supply 32 connected to the gradient coils. The current curves are predetermined by a control computer (not shown).

The currents flowing in the gradient coils produce a considerable heat emission, carried away via a water-cooling system 34. The water cooling system 34 includes cooling ducts that are embedded in the epoxy resin molding material and that are connected to an external cooling unit 37 via cooling lines 36. At suitable locations, one or more temperature sensors 38 are embedded in the epoxy resin molding material, which measure the temperature of the epoxy resin molding material and emit signals to a controller 40. As a target value, the glass transition temperature $T_g$ of the epoxy resin molding material is supplied to the controller 40. The controller 40 is first placed in an operational connection with the gradient current supply 32, in order to heat the gradient system 28 to the glass transition temperature $T_g$ before the examination operation of the magnetic resonance apparatus. During operation, the controller 40 is in operational connection with the cooling system 34, in order to adjust the cooling in such a way that the operating temperature is maintained at the glass transition temperature $T_g$.

Figure 5:
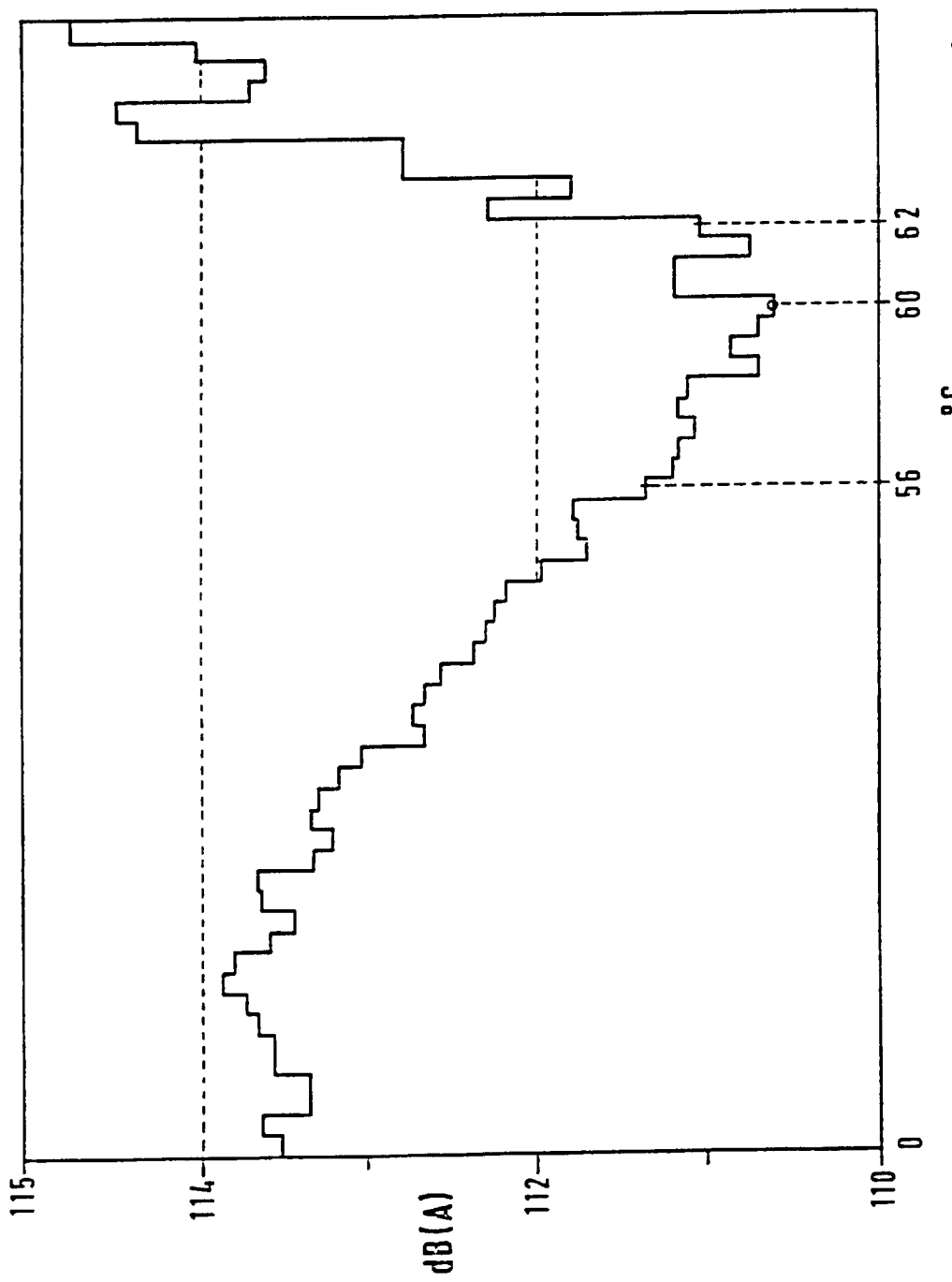
FIG. 5 shows the disturbing noise produced by operating in accordance with the invention method, the gradient system dependent on the temperature.

FIG. 5 shows the noise reduction that can be achieved in the operation of the gradient system 28 at the glass transition temperature $T_g$=60° C. As a reaction resin molding material, an araldite casting resin system with a glass transition temperature of 60° C. is used. A minimum noise level, with a reduction of about 3 dB(A), or 40%, in comparison with the value at room temperature (the area at left in FIG. 5), occurs at the glass transition temperature $T_g$. In the temperature region of about 56° C. to 61° C., the reduction is still 2.5 dB(A). The operating temperature of the gradient system 28 is maintained in this temperature range.

Although various minor modifications might be suggested by those skilled in the art, it should be understood that our wish to embody within the scope of the patent warranted hereon all such modifications as reasonably and properly come with the scope of our contribution to the art.

We claim as our invention:

1. A method for noise reduction in the operation of a gradient coil of a magnetic resonance system comprising the steps of:

placing at least a portion of a gradient coil in contact with a reaction resin molding material having a glass transition temperature region associated therewith; and during operation of said gradient coil, maintaining said reaction resin molding material at a temperature within said glass transition temperature range of said reaction resin molding material.

2. A method as claimed in claim 1 wherein the operation of said gradient coil produces heat, and wherein the step of maintaining said reaction resin molding material at a temperature within the glass transition temperature region of said reaction resin molding material comprises cooling said reaction resin molding material with a cooling system during operation of said gradient coil.

3. A method as claimed in claim 2 wherein the step of cooling said reaction resin molding material during operation of said gradient coil comprises circulating water through said cooling system during operation of said gradient coil.

4. A method as claimed in claim 1 wherein the step of maintaining said reaction resin molding material at a temperature within said glass transition temperature region comprises heating said reaction resin molding material to a temperature within said glass transition temperature region.

5. A method as claimed in claim 4 wherein said gradient coil is operated by a gradient current supply, and wherein the step of heating said reaction resin molding material to a temperature within said glass transition temperature region comprises heating said reaction resin molding material using said gradient current supply.

\* \* \* \* \*